(12) United States Patent
Peng et al.

(10) Patent No.: US 11,500,262 B2
(45) Date of Patent: Nov. 15, 2022

(54) DISTRIBUTED BACKSCATTERING GENERATOR AND MONITOR FOR LASER PERFORMANCE CHARACTERIZATION

(71) Applicant: GLOBALFOUNDRIES U.S. Inc., Santa Clara, CA (US)

(72) Inventors: Bo Peng, Sharon, MA (US); Yusheng Bian, Ballston Lake, NY (US); Michal Rakowski, Ballston Spa, NY (US); Tymon Barwicz, Holmdel, NJ (US)

(73) Assignee: GlobalFoundries U.S. Inc., Malta, NY (US)

( * ) Notice: Subject to any disclaimer, the term of this patent is extended or adjusted under 35 U.S.C. 154(b) by 346 days.

(21) Appl. No.: 16/842,887

(22) Filed: Apr. 8, 2020

(65) Prior Publication Data

US 2021/0318490 A1    Oct. 14, 2021

(51) Int. Cl.
*G02F 1/225* (2006.01)
*G02B 6/122* (2006.01)
*H01S 5/00* (2006.01)
*G02F 1/21* (2006.01)
*H01S 3/00* (2006.01)
*G02F 1/313* (2006.01)

(52) U.S. Cl.
CPC ........... *G02F 1/225* (2013.01); *G02B 6/1228* (2013.01); *H01S 5/005* (2013.01); *G02F 1/212* (2021.01); *G02F 1/3136* (2013.01); *H01S 3/0014* (2013.01)

(58) Field of Classification Search
CPC ...... H01S 5/005; H01S 3/0014; G02F 1/3132; G02F 1/3133; G02F 1/3136
See application file for complete search history.

(56) References Cited

U.S. PATENT DOCUMENTS

2002/0076142 A1* 6/2002 Song ................. H04Q 11/0066
385/16

OTHER PUBLICATIONS

Almeida et al., "Guiding and confining light in void nanostracture," Optics Letters, 29:1209-11, Jun. 1, 2004.
Barrios et al., "Slot-waveguide biochemical sensor," Optics Letters, 32:3080-82, Nov. 1, 2007.
Ronn et al., "Ultra-high on-chip optical gain in erbium-based hybrid slot waveguides," Nature Communications, 10:432.2019.
Van Laer et al., "Analysis of enhanced stimulated Brillouin scattering in silicon slot waveguides," Optics Letters, 39:1242-45, Mar. 1, 2014.

* cited by examiner

*Primary Examiner* — Michael Stahl
(74) *Attorney, Agent, or Firm* — Yee Tze Lim; Hoffman Warnick LLC (57) ABSTRACT

One illustrative backscattering generator disclosed herein includes a low-reflection waveguide structure, a slot waveguide structure comprising a first waveguide, a second waveguide and a slot located between the first waveguide and the second waveguide, and a variable direction coupler operatively coupled to the low-reflection waveguide structure and the slot waveguide structure.

19 Claims, 11 Drawing Sheets

DISTRIBUTED BACKSCATTERING GENERATOR AND MONITOR FOR LASER PERFORMANCE CHARACTERIZATION

BACKGROUND

Field of the Disclosure

Generally, the present disclosure relates to various novel embodiments of a distributed backscattering generator and monitor for laser performance characterization.

Description of the Related Art

Fiber optics communications have gained prominence in telecommunications, instrumentation, cable TV, network, and data transmission and distribution. Photonics chips are used in many applications. A photonics chip integrates optical components, such as waveguides, couplers, optical grating structures, etc., and electronic components, such as integrated circuits comprised of CMOS-based field-effect transistors, into a unified platform. The optical components are formed in a photonics region of the product while the CMOS-based integrated circuits are formed in a CMOS region of the product.

In many applications, a laser is used to generate the light that passes through the optical components of the optical circuit. However, such lasers can be sensitive to back reflection of light from various components, including both point reflection, e.g., from a mirror, and distributed reflections, i.e., back reflections that result from light propagating along an optical component such as a waveguide. These back reflections that are fed back to the laser can adversely impact the performance of the laser, e.g., the laser may become less stable. More specifically, optical parameters of the laser, e.g., stability, laser output power, side mode suppression ratio, etc., may degrade as a result of such back reflections. Typical prior art optical systems used point reflections with a coherent signal, e.g., from a mirror with a tunable power switch to characterize the impact of reflection on the performance capabilities of various laser sources.

The present disclosure is directed to various novel embodiments of a distributed backscattering generator and monitor for laser performance characterization.

SUMMARY

The following presents a simplified summary of at least one disclosed embodiment in order to provide a basic understanding of some aspects of the subject matter disclosed herein. This summary is not an exhaustive overview of all of the subject matter disclosed herein. It is not intended to identify key or critical elements of the subject matter disclosed herein or to delineate the scope of any claims directed to any of the subject matter disclosed herein. Its sole purpose is to present some concepts in a simplified form as a prelude to the more detailed description that is discussed later in the application.

The present disclosure is generally directed to various novel embodiments of a distributed backscattering generator and monitor for laser performance characterization. One illustrative backscattering generator disclosed herein includes a low-reflection waveguide structure, a slot waveguide structure comprising a first waveguide, a second waveguide and a slot located between the first waveguide and the second waveguide, and a variable direction coupler operatively coupled to the low-reflection waveguide structure and the slot waveguide structure.

BRIEF DESCRIPTION OF THE DRAWINGS

The disclosure may be understood by reference to the following description taken in conjunction with the accompanying drawings, in which like reference numerals identify like elements, and in which.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase. As will be readily apparent to those skilled in the art upon a complete reading of the present application, the presently disclosed method may be applicable to a variety of products, including, but not limited to, logic products, memory products, etc. With reference to the attached figures, various illustrative embodiments of the methods and devices disclosed herein will now be described in more detail. The various components, structures and layers of material depicted herein may be formed using a variety of different materials and by performing a variety of known process operations, e.g., chemical vapor deposition (CVD), atomic layer deposition (ALD), a thermal growth process, spin-coating techniques, masking, etching, etc. The thicknesses of these various layers of material may also vary depending upon the particular application.

Figure 1:
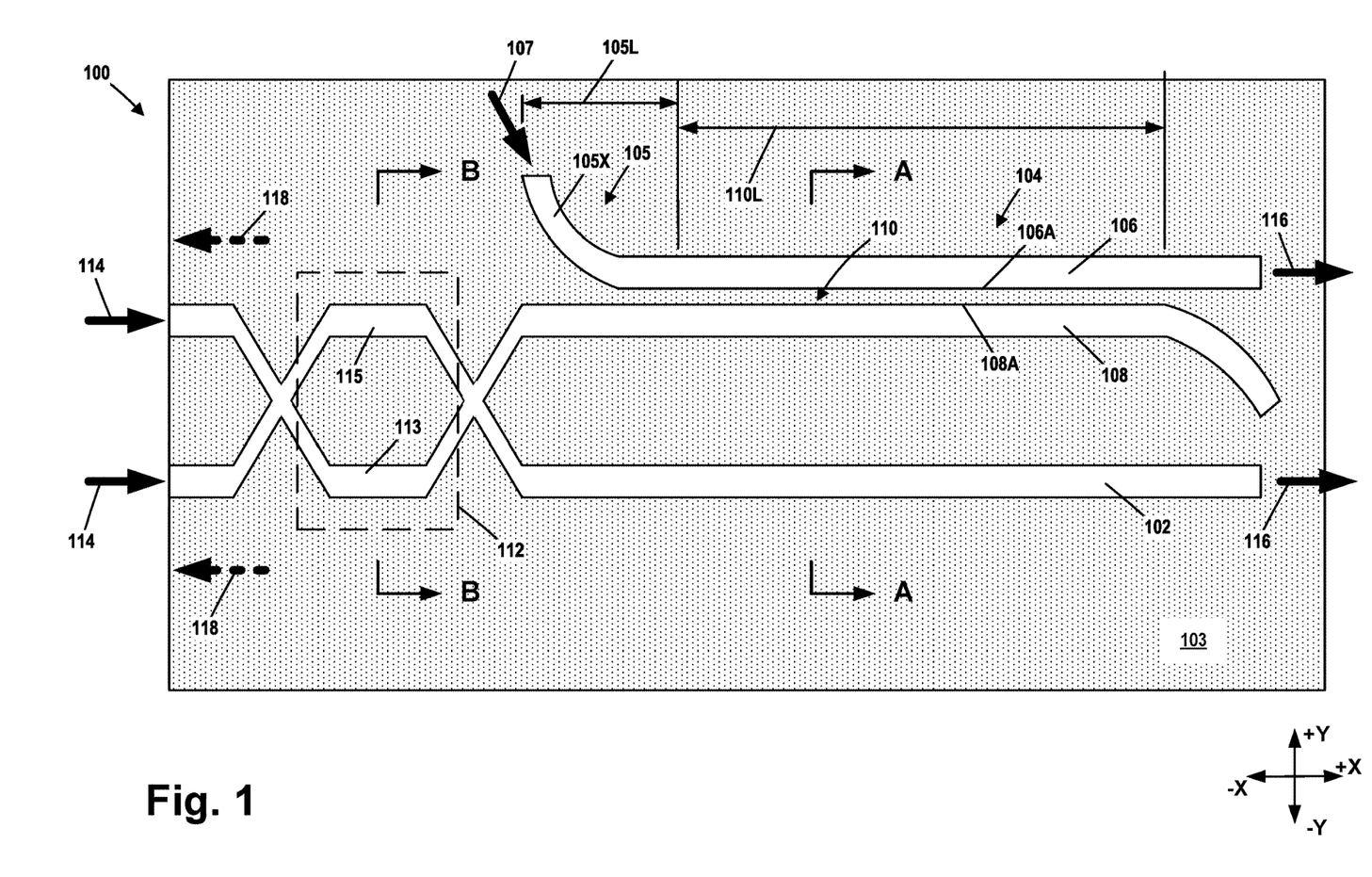
FIGS. 1-11 depict various novel embodiments of a distributed backscattering generator and monitor for laser performance characterization. The drawings are not to scale.

FIGS. 1-11 depict various novel embodiments of a distributed backscattering generator 100 and monitor for laser performance characterization. FIG. 1 is a plan view of one illustrative embodiment of a backscattering generator 100 disclosed herein. The location where various cross-sectional views (A-A and B-B) of various embodiments of the backscattering generator 100 is taken is also depicted in the plan view shown in FIG. 1. Various layers of insulating material that are depicted in the cross-sectional views are not depicted in the plan views so as to facilitate explanation of the subject matter disclosed herein. The drawings also include reference directions (X, Y and Z) in the lower right-hand corner of the drawings.

Figure 2:
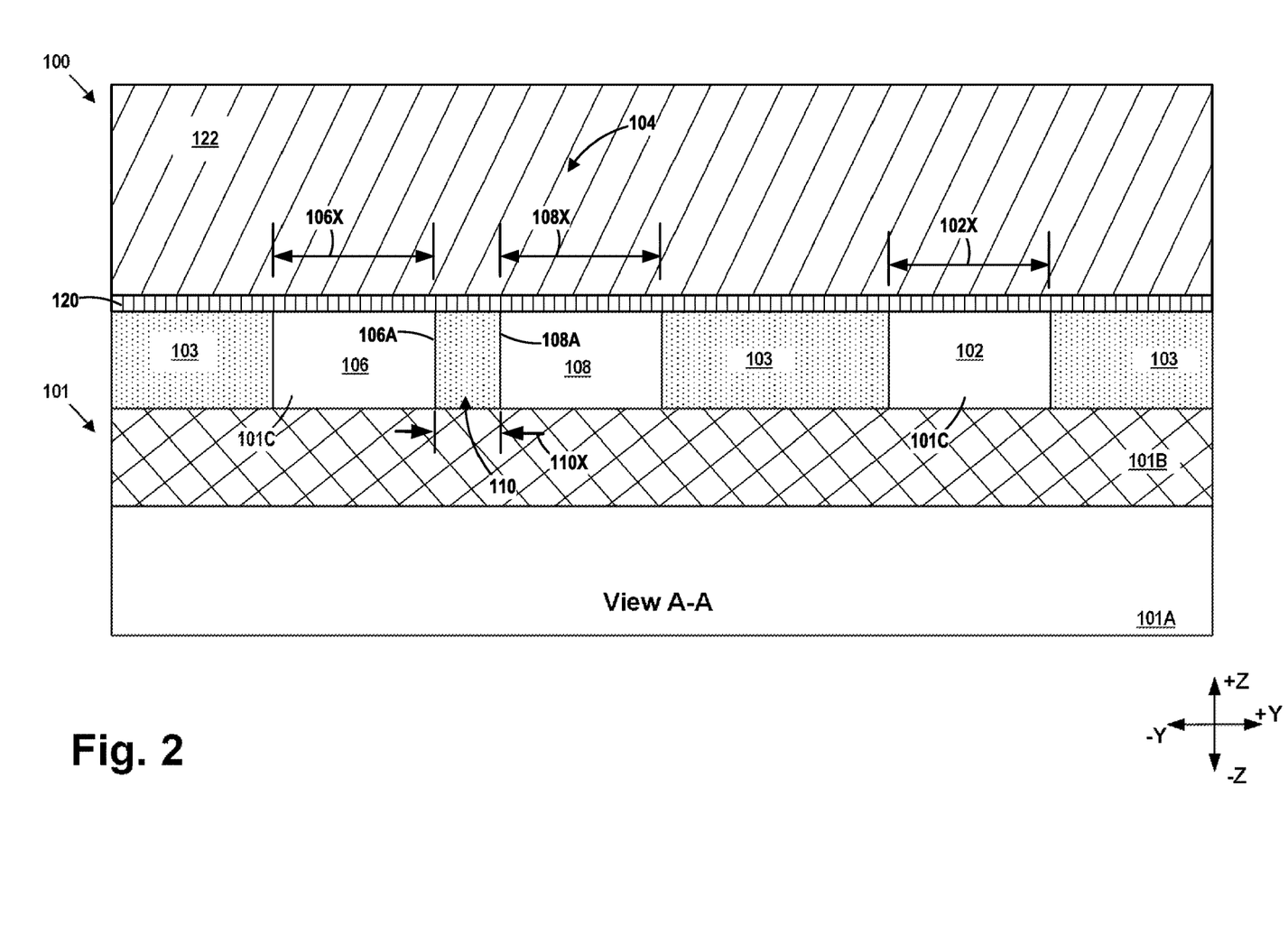

In the depicted examples, and with reference to FIG. 2, the backscattering generator 100 will be formed above a semiconductor substrate 101. The substrate 101 may have a variety of configurations, such as a semiconductor-on-insulator (SOI) substrate shown herein. Such an SOI substrate 101 includes a base semiconductor layer 101A, a buried insulation layer 101B positioned on the base semiconductor layer 101A and an active semiconductor layer 101C positioned above the buried insulation layer 101B. The thickness of the active semiconductor layer 101C and the buried insulation layer 101B may vary depending upon the particular application. In one illustrative embodiment, the active semiconductor layer 101C may be substantially free of any appreciable amount of dopant material, i.e., the active semiconductor layer 101C may be an intrinsic semiconductor material. The active semiconductor layer 101C and the base semiconductor layer 101A need not be made of the same semiconductor material, but that may be the case in some applications. In some applications, the active semiconductor layer 101C and the base semiconductor layer 101A may be made of silicon or they may be made of semiconductor materials other than silicon. Thus, the terms "substrate" or "semiconductor substrate" should be understood to cover all semiconductor materials and all forms of such materials. The buried insulation layer 101B may comprise any desired insulating material, e.g., silicon dioxide, silicon nitride, etc.

Figure 3:
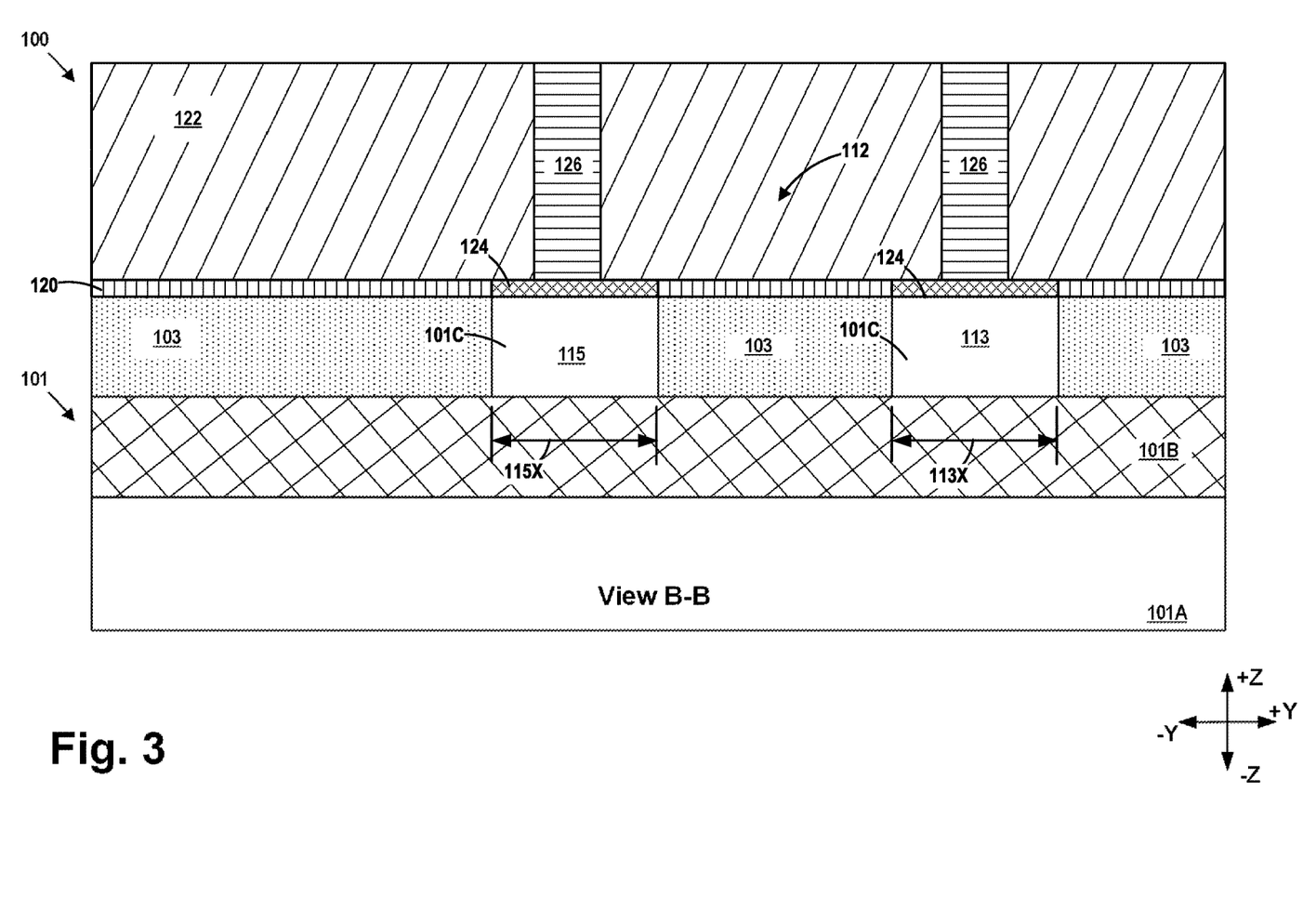

FIG. 1 (plan view) and FIGS. 2-3 (cross-sectional views) depict one illustrative embodiment of the backscattering generator 100 disclosed herein. As depicted, the illustrative backscattering generator 100 comprises a low-reflection waveguide structure 102, a slot waveguide structure 104, a low loss converter structure 105 and a variable direction coupler 112 (e.g., a thermal phase shifter) depicted within the dashed line region shown in FIG. 1. The slot waveguide structure 104 comprises a first waveguide 106 (with a side surface 106A) and a second waveguide 108 (with a side surface 108A). The side surfaces 106A, 108A also define a slot 110 therebetween. The low loss converter structure 105 is coupled to the first waveguide 106. As will be appreciated by those skilled in the art after a complete reading of the present application, the low loss converter structure 105 is adapted to convert standard single mode waveguide 107 into the slot waveguide. In the depicted example, the low loss converter structure 105 comprises a curved section 105X that is connected to the first waveguide 106. The size and degree of curvature of the curved section 105X as well as the axial length 105L of the low loss converter structure 105 may vary depending upon the particular application. The variable direction coupler 112 comprises a first phase shifter structure 113 based on a high index material and a second phase shifter structure 115 based on the same type of high index material. The cross-sectional view A-A is taken through the low-reflection waveguide structure 102 and the slot waveguide structure 104 in the Y direction. The cross-sectional view B-B is taken through the variable direction coupler 112 in the Y direction. In one illustrative embodiment, all of the basic components of the backscattering generator 100 may be formed in the active semiconductor layer 101C of the substrate 101.

Also depicted in FIG. 1 is incident light 114 that is directed to the backscattering generator 100 from one or more lasers (not shown), light 116 that exits the backscattering generator 100 and back reflections of light 118 that are reflected back toward the laser(s). FIG. 1 also depicts a layer of insulating material 103, e.g., silicon dioxide, that is formed above the buried insulation layer 101B of the substrate 101. As noted above, various other layers of insulating material shown in the cross-sectional views shown in FIGS. 2 and 3 are not shown in FIG. 1.

FIG. 2 depicts a layer of insulating material 120, e.g., silicon dioxide, that was formed above the upper surface of the low-reflection waveguide structure 102, the slot waveguide structure 104 and the variable direction coupler 112. Also depicted in FIG. 2 is a representative one or more layers of insulating material 122. In a real-world device, the one or more layers of insulating material 122 may comprise multiple layers of material and the layers of material may be made of different materials. For example, the one or more layers of insulating material 122 may comprise one of more layers of silicon dioxide with a layer of silicon nitride (which functions as an etch stop layer) positioned between the layers of silicon dioxide. The structure, composition and techniques used to form such layer(s) of insulating material 120, 122 are well known to those skilled in the art. With reference to FIGS. 2 and 3, and as mentioned above, in one illustrative embodiment, the components of the backscattering generator 100 were formed by patterning the active semiconductor layer 101C of the substrate 101 by performing known masking and etching techniques. Thereafter, an insulating material 103 was deposited on the substrate 101 and a chemical mechanical planarization (CMP) process was performed to remove excess amounts of the insulating material 103 from above the upper surface of the active semiconductor layer 101C. Of course, the backscattering generator 100 may be formed in any active photonics layer above the substrate 101, i.e., the low-reflection waveguide structure 102, the first waveguide 106 and the second waveguide 108 of the slot waveguide structure 104, the first phase shifter structure 113 and the second phase shifter structure 115 of the variable direction coupler 112 need not be etched from the active semiconductor layer 101C (as described above) but that may be the case in some applications.

With reference to FIGS. 2 and 3, the physical dimensions, e.g., the lateral width (in the Y direction), the axial length (in the X direction) and the thickness (in the Z direction) of the low-reflection waveguide structure 102, the first waveguide 106 and the second waveguide 108 of the slot waveguide structure 104, the first phase shifter structure 113 and the second phase shifter structure 115 of the variable direction coupler 112 and the slot 110 may all vary depending upon the particular application. As depicted in FIG. 2, the low-reflection waveguide structure 102 has a lateral width 102X, the first waveguide 106 of the slot waveguide structure 104 has a lateral width 106X and the second waveguide 108 of the slot waveguide structure 104 has a lateral width 108X. As depicted in FIG. 3, the first phase shifter structure 113 of the variable direction coupler 112 has a lateral width 113X and the second phase shifter structure 115 of the variable direction coupler 112 has a lateral width 115X. In one illustrative example, based upon current-day technology, the lateral width 102X may be about 800-2000 nm, the lateral width 106X may be about 50-500 nm, the lateral width 108X may be about 50-500 nm, the lateral width 113X may be about 50-500 nm and the lateral width 115X may be about 50-500 nm. In the depicted example, the low-reflection waveguide structure 102, the first waveguide 106 and the second waveguide 108 of the slot waveguide structure 104, the first phase shifter structure 113 and the second phase shifter structure 115 of the variable direction coupler 112 all have substantially the same vertical thickness (in the Z direction) of about 150-220 nm.

In one particular example, the lateral widths 102X, 106X, 108X, 113X and 115X may be approximately the same, but that may not be the case in all applications, i.e., the physical dimensions of the low-reflection waveguide structure 102, the first waveguide 106 and the second waveguide 108 of the slot waveguide structure 104, the first phase shifter structure 113 and the second phase shifter structure 115 of the variable direction coupler 112 may all be different from one another. In one illustrative example, the lateral width 102X of the low-reflection waveguide structure 102 may be significantly larger than the lateral width 106X of the first waveguide 106 and/or the lateral width 108X of the second waveguide 108. Moreover, in one illustrative example, the low-reflection waveguide structure 102 may be a multi-mode waveguide structure while, in other embodiments, the low-reflection waveguide structure 102 may be a single mode waveguide structure.

The slot 110 of the slot waveguide structure 104 has a lateral width 110X (in the Y direction—see FIG. 2) and an axial length 110L (in the X direction—see FIG. 1). The lateral width 110X and the axial length 110L of the slot 110 may vary depending upon the particular application. In one illustrative example, based upon current-day technology, the lateral width 110X may be about 10-1000 nm and the axial length 110L may be about 3-50 mm. The height of the slot 110 will be determined by the vertical thickness of the first waveguide 106 and the second waveguide 108 of the slot waveguide structure 104.

With reference to FIG. 3, layers of metal silicide 124 were formed on the upper surfaces of the first phase shifter structure 113 and the second phase shifter structure 115 of the variable direction coupler 112 by performing known manufacturing techniques. Also depicted in FIG. 3 are illustrative and representative conductive contact structures 126 that are formed so as to conductively contact the layers of metal silicide 124. Any desired number of the conductive contacts 126 may be formed on the product using materials and techniques that are well known to those skilled in the art. As will be described more fully below, in one illustrative embodiment, heat energy will be supplied to the first phase shifter structure 113 and the second phase shifter structure 115 of the variable direction coupler 112 via electrical resistance heating.

The low-reflection waveguide structure 102, the first waveguide 106 and the second waveguide 108 of the slot waveguide structure 104, the first phase shifter structure 113 and the second phase shifter structure 115 of the variable direction coupler 112 may be comprised of any desired material, e.g., silicon, silicon germanium, silicon nitride, aluminum nitride, etc. The low-reflection waveguide structure 102, the first waveguide 106 and the second waveguide 108 of the slot waveguide structure 104, the first phase shifter structure 113 and the second phase shifter structure 115 of the variable direction coupler 112 need not be made of the same material, but that may be the case in some applications.

Figure 4:
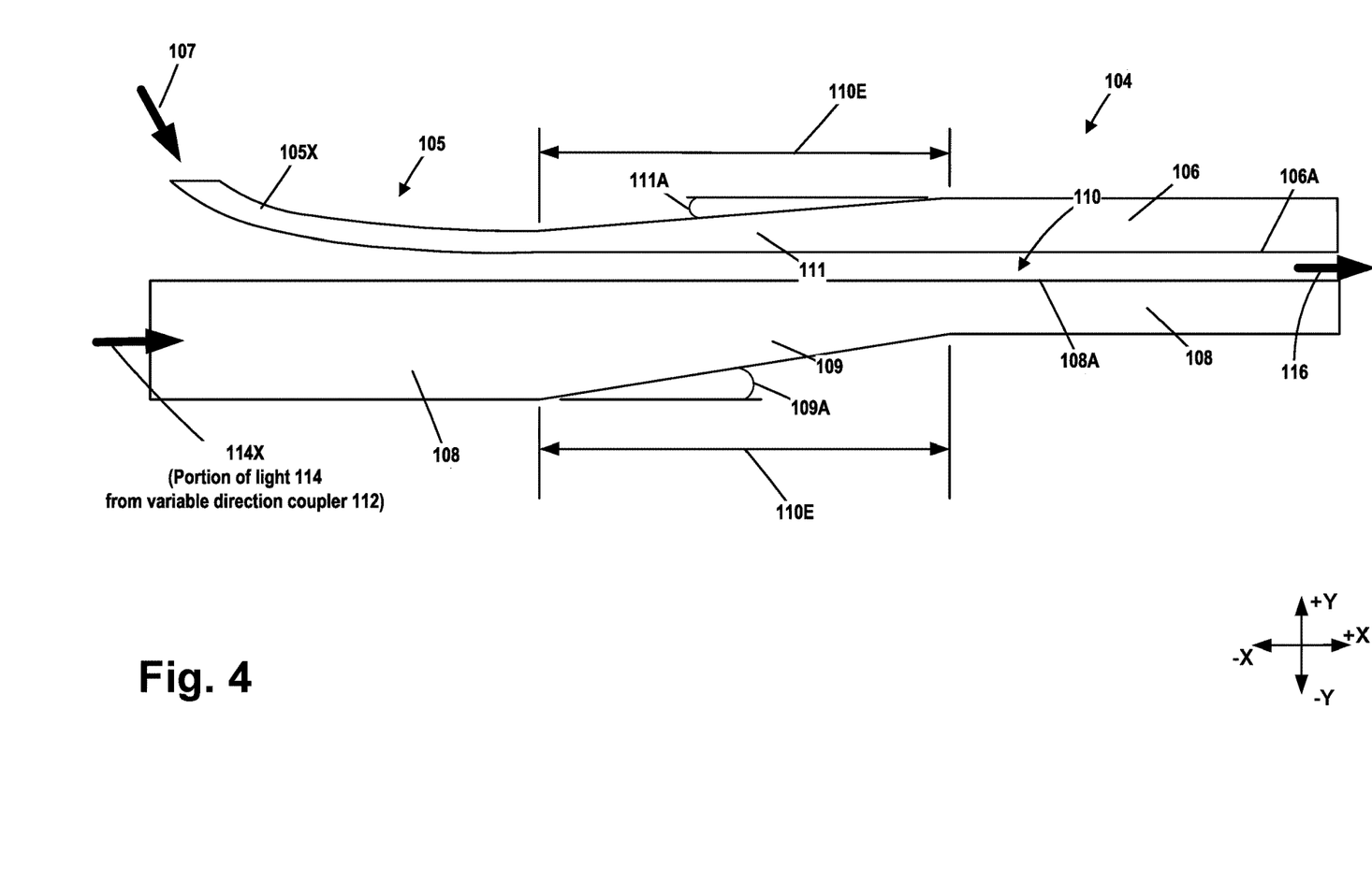

FIG. 4 depicts another illustrative novel embodiment of a slot waveguide structure 104 that may be employed with the various embodiments of the backscattering generator 100 disclosed herein. As before, the backscattering generator 100 comprises a low-reflection waveguide structure 102, a low loss converter structure 105 and a variable direction coupler 112 (e.g., a thermal phase shifter) that is not shown in FIG. 4. As before, the slot waveguide structure 104 comprises the first waveguide 106 (with the side surface 106A) and the second waveguide 108 (with a side surface 108A). The side surfaces 106A, 108A also define the above-described slot 110 therebetween. The low loss converter structure 105 is coupled to the first waveguide 106. As before, the low loss converter structure 105 is adapted to convert a standard single mode waveguide 107 into the slot waveguide. In the depicted example, the low loss converter structure 105 comprises the above-described curved section 105X that is connected to the first waveguide 106.

In the embodiment shown in FIG. 4, at the entrance section 110E of the slot 110, the second waveguide 108 has an inwardly tapered section 109 while the first waveguide 106 has an outwardly tapered section 111. Stated another way, when viewed from above, the width of the inwardly tapered section 109 decreases as one progresses in the direction corresponding to the direction of light travel through the slot 110, i.e., left to right in FIG. 4. Conversely, when viewed from above, the width of the outwardly tapered section 111 increases as one progresses in the direction corresponding to the direction of light travel through the slot 110. The degree of tapering of the tapered sections 109, 111 may vary depending upon the particular application. In the depicted example, the outer surfaces of the tapered sections 109, 111 are tapered at an angle 109A, 111A, respectively relative to a line that is substantially parallel to the direction of light propagation through the slot 110. The angles 109A and 111A need not be the same, but that may be the case in some applications. By providing the tapered sections 109, 111, better performance may be achieved because mode conversion becomes adiabatic without strong mismatch and disruption. This helps suppression of the junction loss and suppression of reflection noise generation. The axial lengths of the tapered sections 109 and 111 in a direction corresponding to the direction of light travel through the slot 110 may vary depending upon the particular application. Moreover, the axial lengths of the tapered sections 109 and 111 may extend for the entire axial length of the entrance 110E, but that may not be the case in some applications.

Figure 5:
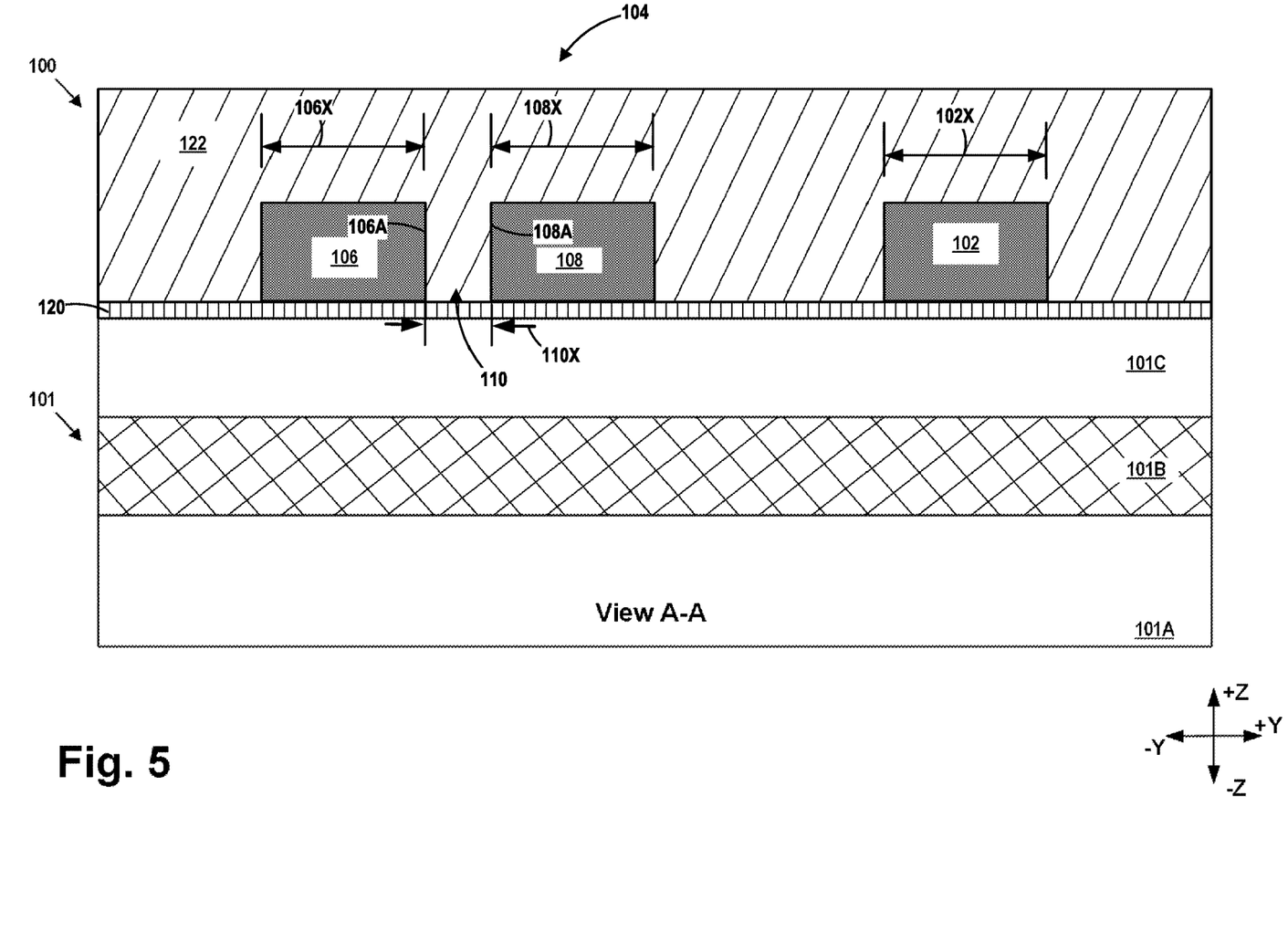
Figure 6:
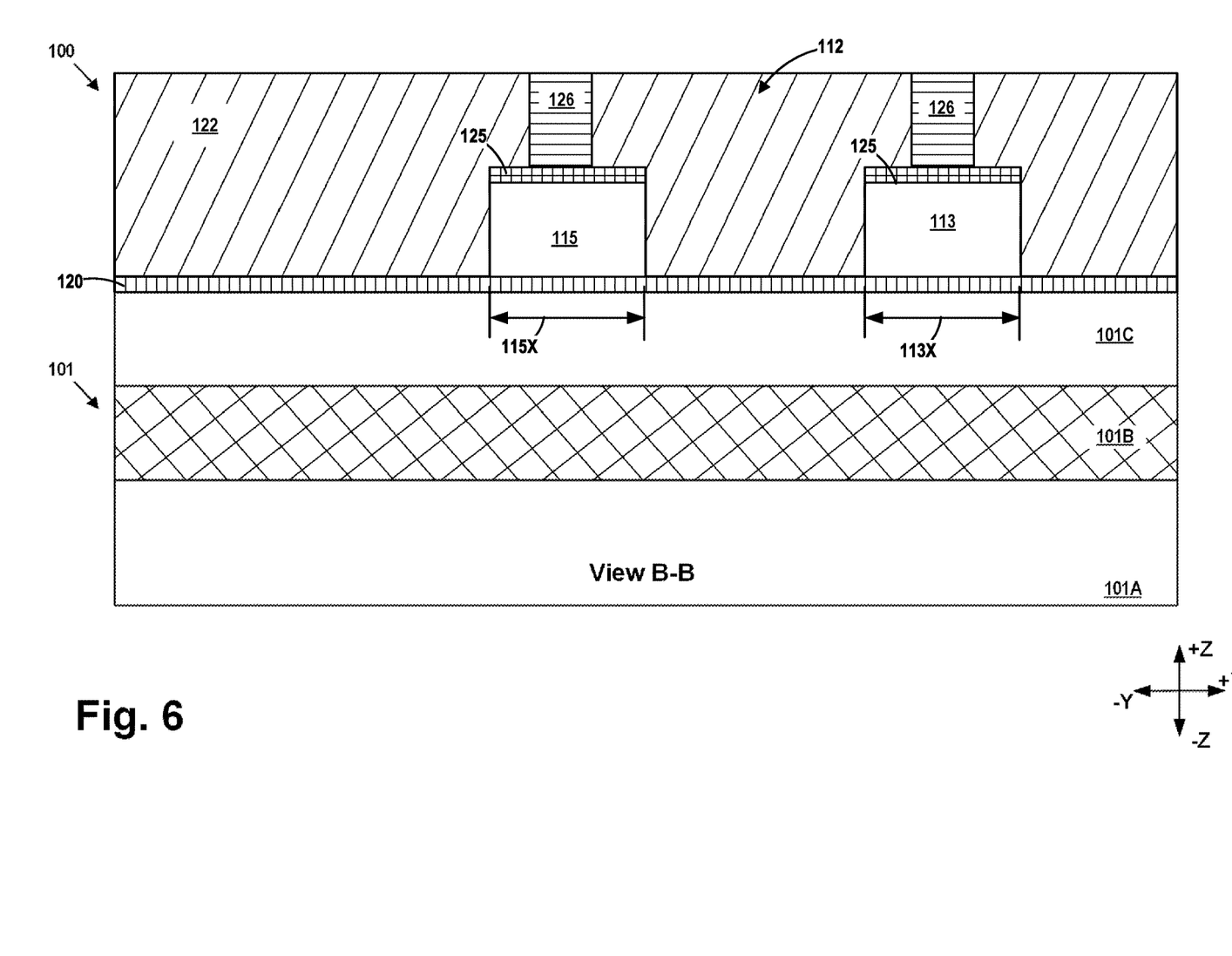

As noted above, the backscattering generator 100 may be formed in any active photonics layer above the substrate 101. FIG. 5 (view A-A) and FIG. 6 (view B-B) are cross-sectional views of an embodiment where the components of the backscattering generator 100, i.e., the low-reflection waveguide structure 102, the first waveguide 106 and the second waveguide 108 of the slot waveguide structure 104, the first phase shifter structure 113 and the second phase shifter structure 115 of the variable direction coupler 112 are formed above the upper surface of the active semiconductor layer 101C, i.e., the components of the backscattering generator 100 are not etched from the active semiconductor layer 101C (as described above). In one embodiment, the components of the backscattering generator 100 may be comprised of a material such as silicon nitride or aluminum nitride and the components of the backscattering generator 100 may be formed by performing known deposition, masking and etching techniques. With reference to FIG. 6, a layer of conductive material 125 may be formed on the first phase shifter structure 113 and the second phase shifter structure 115 of the variable direction coupler 112 so as to permit the desired heating of the variable direction coupler 112.

Figure 7:
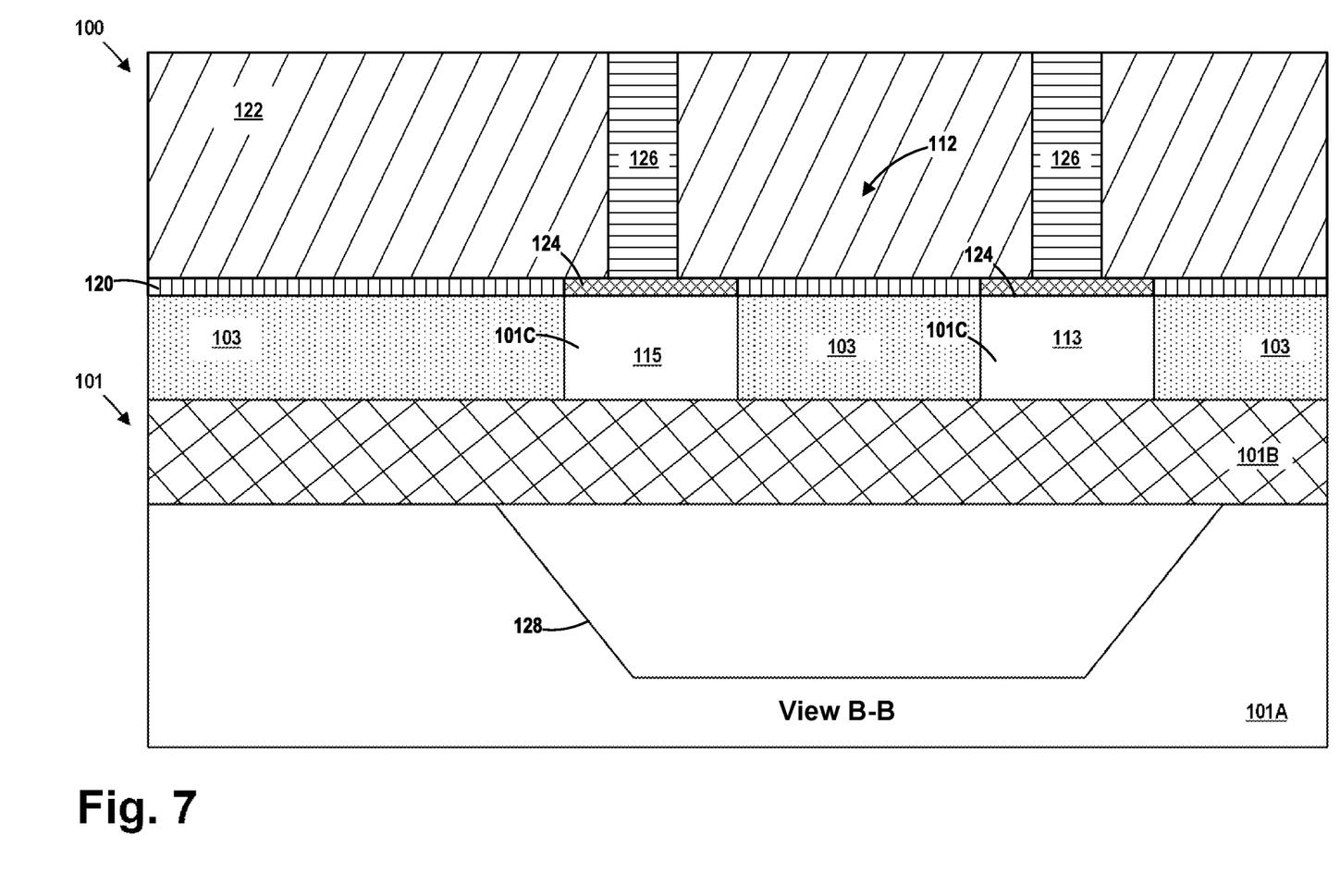

FIG. 7 depicts an alternative embodiment of the backscattering generator 100 wherein a trench 128 has been formed in the base semiconductor layer 101A under the variable direction coupler 112 shown in FIG. 3. In one illustrative embodiment, the trench 128 may take the form of a common "V" trench that is formed in a substrate so as to secure a fiber optic cable to the substrate. Various techniques used to form such trenches are well known to those skilled in the art. One illustrative technique for forming the trench 128 is disclosed in U.S. patent application (Ser. No. 16/807,811) entitled "Methods of Forming a V-Groove for a Fiber Optics Cable on an Integrated Photonics Chip" that was filed on Mar. 3, 2020 and is assigned to the assignee of the present application. In one particular example, the axial length (in the X direction) of the trench 128 is at least as long as the axial length (in the X direction) of the first phase shifter structure 113 and the second phase shifter structure 115 of the variable direction coupler 112. If present, the purpose of the trench 128 is to provide for more efficient heating of the first phase shifter structure 113 and the second phase shifter structure 115 of the variable direction coupler 112.

Figure 8:
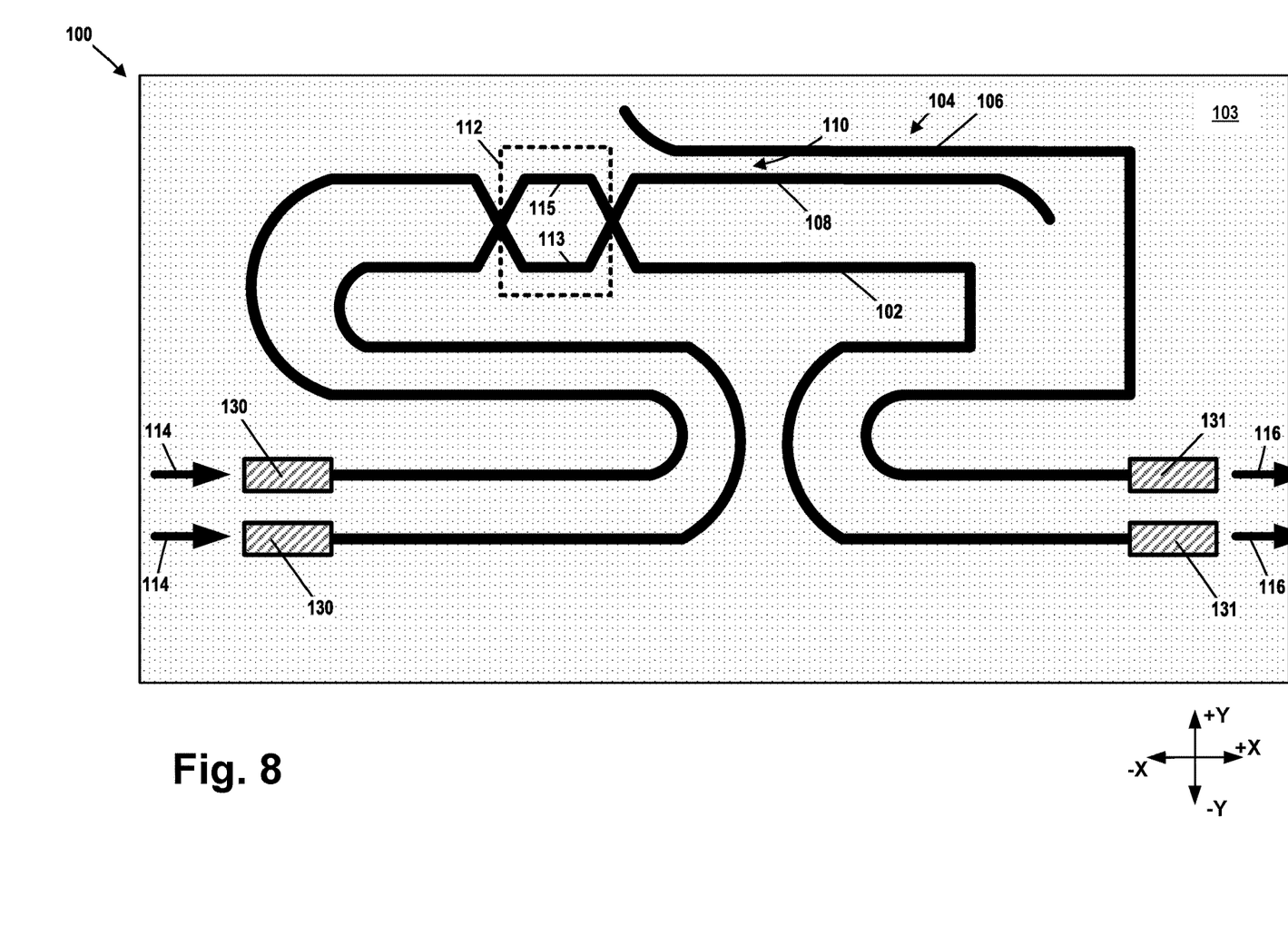

FIG. 8 is a plan view of an embodiment of the backscattering generator 100 wherein light 114 is input to the backscattering generator 100 via two fiber optic cables 130 and light 116 exits the backscattering generator 100 via two fiber optic cables 131. In one illustrative embodiment, the backscattering generator 100 may be coupled to the fiber optic cables 130, 131 with spot-size converter connections. A spot-size converter coupler between each of the fiber optic cables 130, 131 and the backscattering generator 100 is not shown in FIG. 8.

Figure 9:
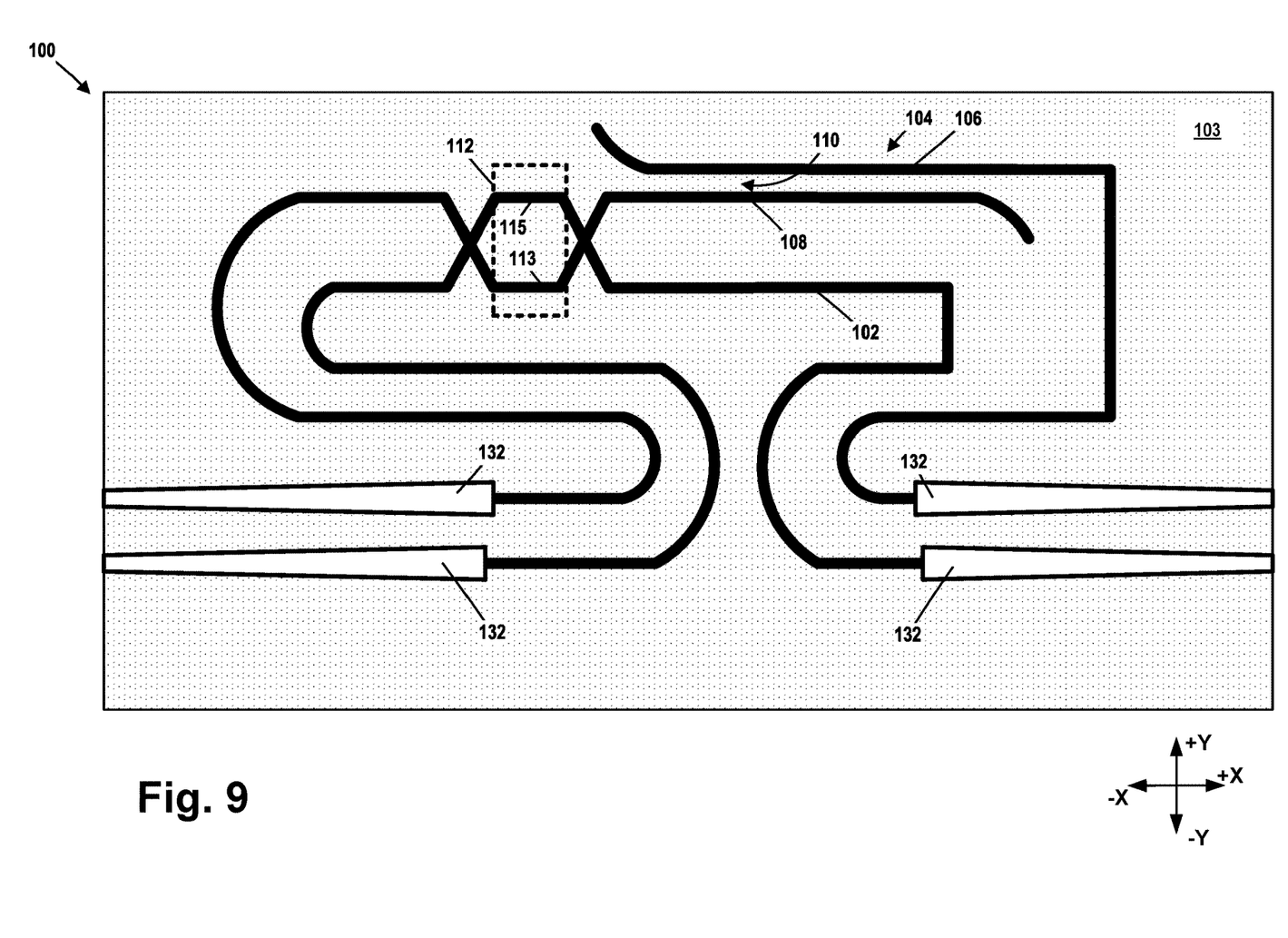

FIG. 9 is a plan view of an embodiment of the backscattering generator 100 wherein the backscattering generator 100 has schematically depicted inverse tapers 132 to convert the mode to the external coupler (not shown).

In terms of operation, in one illustrative embodiment, the low-reflection waveguide structure 102 is still maintained to operate the fundamental light modes (e.g., transverse-electric (TE) mode, without excitation of higher orders of light modes, e.g., second or third order light modes. With reference to FIGS. 1-3, there is negligible back reflection 118, i.e., distributed reflections as a result of light propagating through the low-reflection waveguide structure 102. However, in the backscattering generator 100 disclosed herein, the slot waveguide structure 104 is sized and configured to intentionally generate significant back reflections 118, i.e., distributed reflections as light propagates through the slot waveguide structure 104. One factor that contributes to the generation of distributed reflections by the slot waveguide structure 104 is the surface roughness of the sidewalls 106A, 108A of the slot 110. Typically, the first waveguide 106 and the second waveguide 108 of the slot waveguide structure 104 are formed by performing an anisotropic etching process, e.g., an RIE process, that naturally leads to some degree of surface roughness. Another factor that leads to the generation of distributed reflections from the slot waveguide structure 104 is the axial length 110L of the slot as well as the lateral width 110X of the slot 110.

In general, energy—in the form of electrical resistance heating in the depicted example—is supplied to the first phase shifter structure 113 and the second phase shifter structure 115 of the variable direction coupler 112 so as to direct a first portion of the incident light 114 to the low-reflection waveguide structure 102 and a second portion of the incident light 114 to the slot waveguide structure 104. The manner in which this may be done is well known to those skilled in the art, under a Mach-Zehnder Interferometer configuration. The ratio of the amount of the incoming light 114 directed to the slot waveguide structure 104 as compared to the amount of the incoming light 114 directed to the low-reflection waveguide structure 102 may be controlled or tuned to virtually any number. For example, in one application, the variable direction coupler 112 may be heated in such a manner that approximately 80% of the incoming light 114 is directed to and propagates along the slot waveguide structure 104 while approximately 20% of the incoming light 114 is directed to and propagates along the low-reflection waveguide structure 102. In other applications, the variable direction coupler 112 may be heated in such a manner that the reverse is true—approximately 20% of the incoming light 114 is directed to and propagates along the slot waveguide structure 104 while approximately 80% of the incoming light 114 is directed to and propagates along the low-reflection waveguide structure 102. Thus, the backscattering generator 100 may be tuned or controlled in such a manner so as to regulate the desired amount of the incident light 114 that is directed to the low-reflection waveguide structure 102 and the slot waveguide structure 104.

As noted above, there is negligible back reflections 118, i.e., distributed reflections, as a result of light propagating through the low-reflection waveguide structure 102. Thus, by regulating the amount of the incident light 114 that propagates through the slot waveguide structure 104, the amount of distributed reflections 118 from the slot waveguide structure 104 that are reflected back to the laser(s) (not shown) may be controlled and used to characterize the performance of the laser(s) when subjected to such varying amounts of distributed back reflections 118 from the slot waveguide structure 104. The varied amount of distributed back reflection signals can be preliminarily evaluated when connected with a spectrometer instead of a laser. And while the laser characterization is being performed, the transmission signal through the low-reflection waveguide structure 102 can be collected and monitored in the spectrometer to reflect the real-time laser power fluctuation and side mode excitation to reveal the laser performance.

Figure 10:
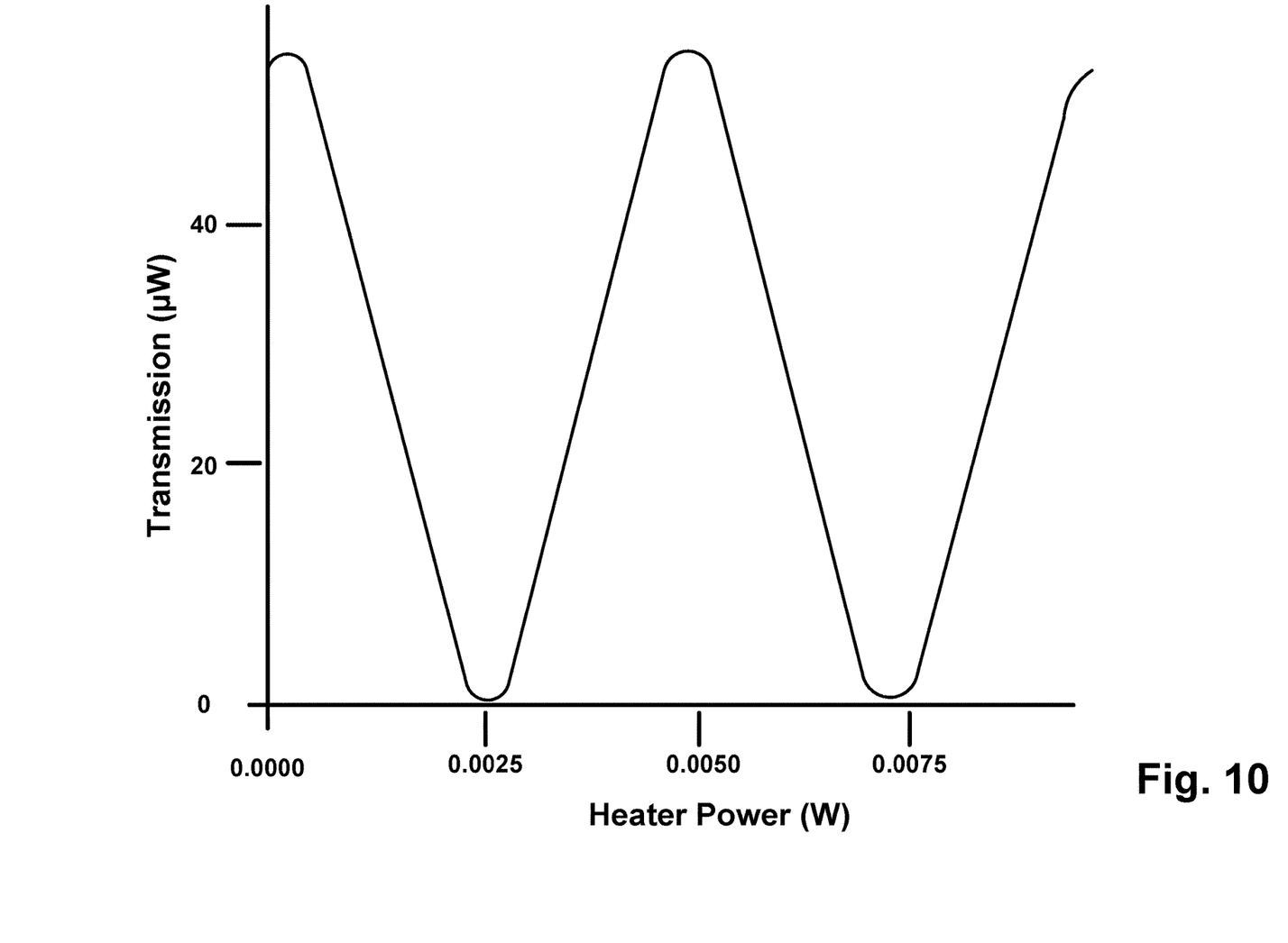
Figure 11:
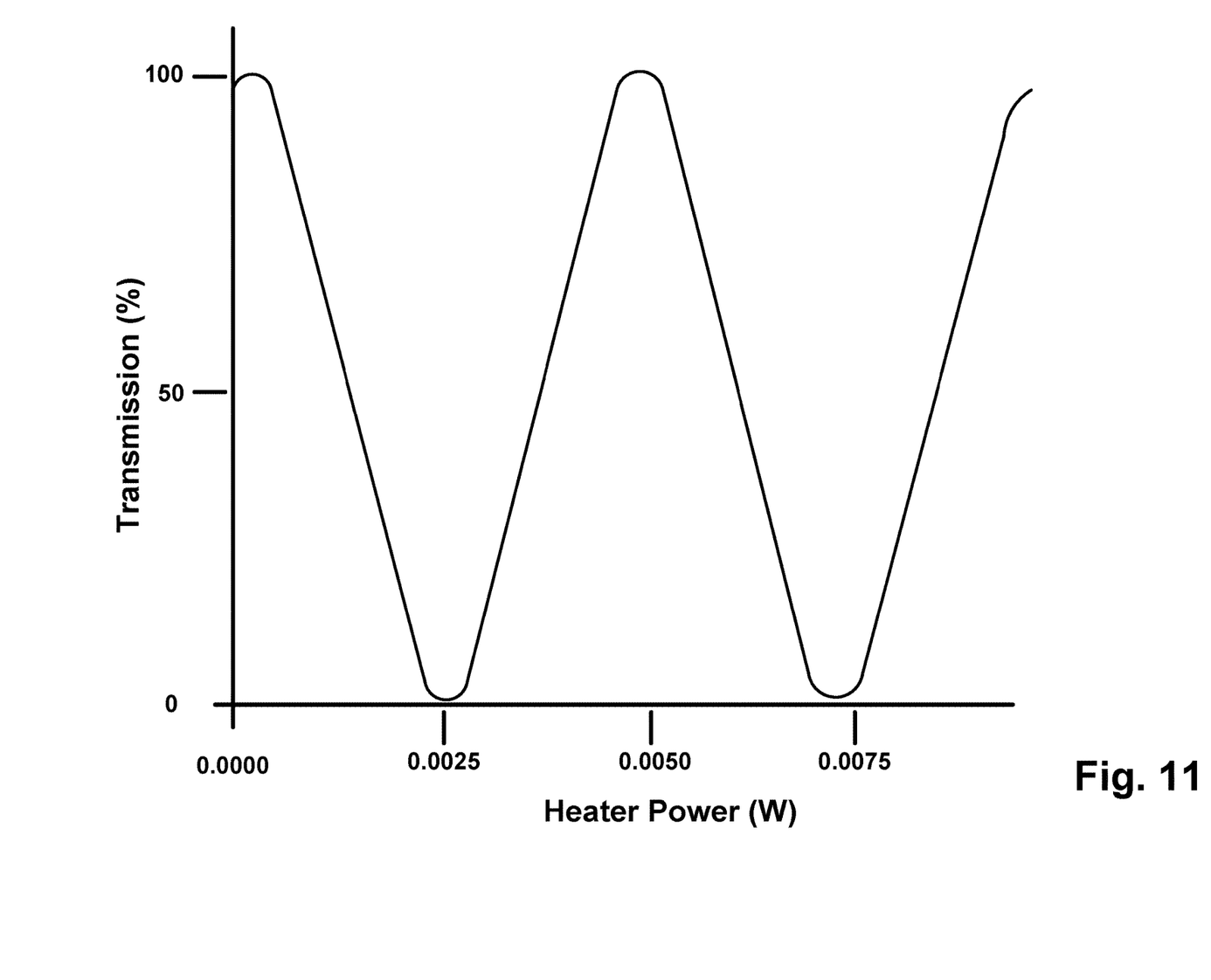

In general, in one illustrative embodiment, the tuning of the backscattering generator 100 disclosed herein may be accomplished based upon Mach-Zehnder interferometer tuning with high efficiency thermal heating input. FIG. 10 is a graph depicting a comparison between the single output port transmission with the power (in watts) supplied to the variable direction coupler 112—as set forth on the abscissa axis—as compared to the transmitted optical power (in micro watts) of the incident light 114—as set forth on the ordinate axis. The same tuning ratio also applies to the reflection signal. As indicated, for a full tuning cycle, the power consumption may be about 2.4 mW—a reasonable value. Alternatively, as shown in FIG. 11, the units of the ordinate access could be replaced with a percentage scale with gradations ranging from 0.0 to 100.

Moreover, as will be appreciated by those skilled in the art after a complete reading of the present application, the slot waveguide structure 104 disclosed herein provides for a wider tuning range of the back reflection 118 from the slot waveguide structure 104. For example, modeling has shown the following signal enhancement of the back reflection from the slot waveguide structure 104 as compared to standard single mode waveguide case.

| Width of Waveguides 106 and 108 | Slot width 110X | Signal enhancement |
|---|---|---|
| 220 nm | 140 nm | 9.5 dB |
| 200 nm | 80 nm | 13.2 dB |
| 200 nm | 60 nm | 15.2 dB |

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Note that the use of terms, such as "first," "second," "third" or "fourth" to describe various processes or structures in this specification and in the attached claims is only used as a shorthand reference to such steps/structures and does not necessarily imply that such steps/structures are performed/formed in that ordered sequence. Of course, depending upon the exact claim language, an ordered sequence of such processes may or may not be required. Accordingly, the protection sought herein is as set forth in the claims below.

The invention claimed is:

1. A backscattering generator, comprising:
a low-reflection waveguide structure;
a slot waveguide structure comprising a first waveguide, a second waveguide and a slot located between the first waveguide and the second waveguide; and
a variable direction coupler operatively coupled to the low-reflection waveguide structure and the slot waveguide structure, the variable direction coupler including a first phase shifter structure and a second phase shifter structure.

2. The backscattering generator of claim 1, wherein the low-reflection waveguide structure is a multi-mode low-reflection waveguide structure, and wherein the multi-mode low-reflection waveguide structure, the first waveguide and the second waveguide of the slot waveguide structure and the variable direction coupler comprise one of silicon, silicon germanium, silicon nitride, or aluminum nitride.

3. The backscattering generator of claim 1, wherein the low-reflection waveguide structure, the first waveguide and the second waveguide of the slot waveguide structure and the variable direction coupler comprise a same material.

4. The backscattering generator of claim 1, wherein the low-reflection waveguide structure, the first waveguide and the second waveguide of the slot waveguide structure and the variable direction coupler comprise a material of an active semiconductor layer of a semiconductor substrate.

5. The backscattering generator of claim 1, wherein the low-reflection waveguide structure, the first waveguide and the second waveguide of the slot waveguide structure and the variable direction coupler are positioned above an upper surface of an active semiconductor layer of a semiconductor-on-insulator substrate.

6. The backscattering generator of claim 1, wherein the slot has a lateral width in a direction that is transverse to a direction of light propagation through the slot and an axial length in a direction that is parallel to a direction of light propagation through the slot and the low-reflection waveguide structure has a lateral width in a direction that is transverse to a direction of light propagation through the slot, wherein the lateral width of the slot falls within a range of about 10-1000 nm, the axial length of the slot falls within a range of about 3-50 mm and the lateral width of the low-reflection waveguide structure falls within a range of about 800-2000 nm.

7. The backscattering generator of claim 1, further comprising means for heating the variable direction coupler.

8. The backscattering generator of claim 1, further comprising:
a conductive material formed on an upper surface of each of the first phase shifter structure and the second phase shifter structure of the variable direction coupler; and
at least one conductive contact coupled to the conductive material.

9. The backscattering generator of claim 8, wherein the conductive material comprises one of a metal silicide or a conductive layer of metal.

10. The backscattering generator of claim 1, further comprising a low loss converter structure comprising a curved section that is operatively coupled to the first waveguide.

11. The backscattering generator of claim 1, wherein the slot comprises an entrance section and wherein the first waveguide comprises a first tapered section positioned adjacent at least a portion of the entrance section of the slot and the second waveguide comprises a second tapered section positioned adjacent at least a portion of the entrance section of the slot, wherein, when viewed from above, a width of the first tapered section increases as one progresses in a direction corresponding to the direction of light travel through the slot and wherein, when viewed from above, a width of the second tapered section decreases as one progresses in the direction corresponding to the direction of light travel through the slot.

12. The backscattering generator of claim 11, wherein the entrance section of the slot has an axial length and wherein both the first tapered section and the second tapered section have an axial length that is substantially equal to the axial length of the entrance section.

13. A backscattering generator, comprising:
a low-reflection waveguide structure;
a slot waveguide structure comprising a first waveguide, a second waveguide and a slot located between the first waveguide and the second waveguide;
a low loss converter structure comprising a curved section that is operatively coupled to the first waveguide;
a variable direction coupler operatively coupled to the low-reflection waveguide structure and the slot waveguide structure, wherein the variable direction coupler comprises a first phase shifter structure and a second phase shifter structure;
a conductive material formed on an upper surface of each of the first phase shifter structure and the second phase shifter structure of the variable direction coupler; and
at least one conductive contact coupled to the conductive material.

14. The backscattering generator of claim 13, wherein the slot has a lateral width in a direction that is transverse to a direction of light propagation through the slot and an axial length in a direction that is parallel to a direction of light propagation through the slot and the low-reflection waveguide structure has a lateral width in a direction that is transverse to a direction of light propagation through the slot, wherein the lateral width of the slot falls within a range of about 10-1000 nm, the axial length of the slot falls within a range of about 3-50 mm and the lateral width of the low-reflection waveguide structure falls within a range of about 800-2000 nm.

15. The backscattering generator of claim 14, wherein the slot comprises an entrance section and wherein the first waveguide comprises a first tapered section positioned adjacent at least a portion of the entrance section and the second waveguide comprises a second tapered section positioned adjacent at least a portion of the entrance section, wherein, when viewed from above, a width of the first tapered section increases as one progresses in a direction corresponding to the direction of light travel through the slot and wherein, when viewed from above, a width of the second tapered section decreases as one progresses in the direction corresponding to the direction of light travel through the slot.

16. The backscattering generator of claim 15, wherein the entrance section has an axial length and wherein both the first tapered section and the second tapered section have an axial length that is substantially equal to the axial length of the entrance section.

17. A backscattering generator, comprising:
a low-reflection waveguide structure;
a slot waveguide structure comprising a first waveguide, a second waveguide and a slot located between the first waveguide and the second waveguide, wherein the slot comprises an entrance section and wherein the first waveguide comprises a first tapered section positioned adjacent at least a portion of the entrance section and the second waveguide comprises a second tapered section positioned adjacent at least a portion of the entrance section, wherein, when viewed from above, a width of the first tapered section increases as one progresses in a direction corresponding to the direction of light travel through the slot and wherein, when viewed from above, a width of the second tapered section decreases as one progresses in the direction corresponding to the direction of light travel through the slot;
a low loss converter structure comprising a curved section that is operatively coupled to the first waveguide;
a variable direction coupler operatively coupled to the low-reflection waveguide structure and the slot waveguide structure, wherein the variable direction coupler comprises a first phase shifter structure and a second phase shifter structure;
a conductive material formed on an upper surface of each of the first phase shifter structure and the second phase shifter structure of the variable direction coupler; and
at least one conductive contact coupled to the conductive material.

18. The backscattering generator of claim 17, wherein the entrance section has an axial length and wherein both the first tapered section and the second tapered section have an axial length that is substantially equal to the axial length of the entrance section.

19. The backscattering generator of claim 17, wherein the low-reflection waveguide structure, the first waveguide and the second waveguide of the slot waveguide structure, the low loss converter structure and the variable direction coupler comprise a material of an active semiconductor layer of a semiconductor substrate.

\* \* \* \* \*